(12) United States Patent
Dosho

(10) Patent No.: US 7,319,732 B2
(45) Date of Patent: Jan. 15, 2008

(54) LOW-PASS FILTER AND PHASE LOCKED LOOP

(75) Inventor: Shiro Dosho, Osaka (JP)

(73) Assignee: Matsuhita Electric Industrial Co., Ltd., Osaka (JP)

( * ) Notice: Subject to any disclaimer, the term of this patent is extended or adjusted under 35 U.S.C. 154(b) by 685 days.

(21) Appl. No.: 10/834,202

(22) Filed: Apr. 29, 2004

(65) Prior Publication Data
US 2004/0252803 A1 Dec. 16, 2004

(30) Foreign Application Priority Data
Jun. 11, 2003 (JP) .............................. 2003-165976

(51) Int. Cl.
H03D 3/24 (2006.01)

(52) U.S. Cl. .................................................... 375/376

(58) Field of Classification Search ................ 375/371, 375/373, 374, 376
See application file for complete search history.

(56) References Cited

U.S. PATENT DOCUMENTS

| 6,344,772 B1 | 2/2002 | Larsson |
| 6,437,615 B1 | 8/2002 | Stascausky |
| 6,476,681 B1 * | 11/2002 | Kirkpatrick ................ 331/17 |
| 6,546,059 B1 | 4/2003 | Knoll et al. |

FOREIGN PATENT DOCUMENTS

| JP | 2778421 | 5/1998 |
| WO | WO 03/098807 A1 | 11/2003 |

* cited by examiner

*Primary Examiner*—Kevin Kim
(74) *Attorney, Agent, or Firm*—McDermott Will & Emery LLP

(57) ABSTRACT

The loop filter in the PLL includes: a filter circuit (first partial circuit) including a capacitive element, one end of the first partial circuit being connected to an output terminal of a charge pump circuit, a voltage for controlling a voltage-controlled oscillator being output from the other end of the first partial circuit; a voltage buffer circuit to which a voltage at a predetermined node in the filter circuit is input; and a filter circuit (second partial circuit), one end of the second partial circuit being connected to the output terminal of the charge pump circuit, the other end being connected to an output terminal of the voltage buffer circuit.

3 Claims, 9 Drawing Sheets

LOW-PASS FILTER AND PHASE LOCKED LOOP

BACKGROUND OF THE INVENTION

The present invention relates to a low-pass filter and specifically to a technology of a low-pass filter suitable as a loop filter in a phase locked loop.

In currently-existing semiconductor integrated circuit systems, a phase locked loop (hereinafter, referred to as "PLL") is one of the indispensable components and is incorporated in almost all the LSI devices. The applications of the phase locked loop range over various technological fields, such as communication devices, microprocessors, IC cards, etc.

FIG. 9 shows the structure of a generally-employed charge pump type PLL. General features of the PLL are described with reference to FIG. 9. A frequency phase comparator 10 compares input clock CKin which is supplied to the PLL 100 and feed back clock CKdiv and outputs up signal UP and down signal DN according to the phase difference between the compared clocks. A charge pump circuit 20 outputs (releases or sucks) electric current Ip based on up signal UP and down signal DN. A loop filter 30 smoothes electric current Ip and outputs voltage Vout as a result of the smoothing of electric current Ip. A voltage controlled oscillator 40 changes the frequency of output clock CKout of the PLL 100 based on voltage Vout. A frequency divider 50 divides output clock CKout by N, and a resultant clock is fed back as feedback clock CKdiv to the phase comparator 10. By repeating the above operation, output clock CKout gradually converges on a predetermined frequency and is locked.

The loop filter 30 is an especially significant component among the above components of the PLL 100. It can be said that the response characteristic of the PLL 100 is determined according to the filter characteristics, i.e., transfer characteristic, of the loop filter 30.

According to the control theory for PLLs, the response bandwidth of the PLL is preferably about a ¹⁄₁₀ of the frequency of the input clock at the maximum. If this theory is followed, in a PLL which receives a reference clock having a relatively low frequency, it is necessary to reduce the cutoff frequency of the loop filter such that the response bandwidth is narrowed. Thus, a loop filter in a conventional PLL has a relatively large time constant, i.e., a large CR product. In general, a larger capacitive element is used in order to achieve a larger CR product.

However, increasing the size of the capacitive element causes an increase in the circuit size. This is a serious problem especially in a semiconductor integrated circuit including a large number of PLLs, such as a microprocessor, or the like. Further, especially in an IC card, it should be avoided, in view of reliability, to incorporate an element thicker than the card. The countermeasure of externally providing a large capacitive element is substantially impossible. Conventionally, the following means have been provided for the purpose of decreasing the size of the capacitive element of the loop filter.

In the first countermeasure example, a loop filter is structured such that a capacitive element and a resistive element, which would generally be connected in series, are separated, and separate electric currents are supplied to these elements. The voltages generated in the elements are added together in an adder circuit, and a resultant voltage is output from the adder circuit (see, for example, the specification of Japanese Patent No. 2778421 (page 3 and FIG. 1)). According to this loop filter, the electric current supplied to the capacitive element is smaller than that supplied to the resistive element, whereby the filter characteristics equivalent to those of a conventional filter are maintained, and the size of the capacitive element is relatively decreased.

The second countermeasure example is a low-pass filter disclosed in a patent application in which the present inventors are concerned (WO 03/098807 A1). In this low-pass filter, a filtering process of an input signal is performed by first filter means, and a filtering process of a second electric current generated based on first electric current flowing through the first filter means is performed by second filter means. Further, the first and second voltages generated in the first and second filter means, respectively, are added together by adder means and a resultant voltage is output from the low-pass filter. In this circuit, the second electric current is generated so as to be smaller than the first electric current, whereby the size of a capacitive element of the second filter means is relatively decreased while the filter characteristics equivalent to those of a conventional low-pass filter are maintained.

As described above, a large capacitive element which has a large capacitance value is generally required in a loop filter. This causes an increase in the entire circuit area of the PLL. The PLL is used in various application products, and therefore, the reduction of the circuit size of the PLL is an inevitable challenge to be addressed.

SUMMARY OF THE INVENTION

In view of the above problems, an objective of the present invention is to reduce the size of a low-pass filter as compared with a conventional low-pass filter by using a solution different from the above-described conventional techniques while maintaining the transfer characteristic equivalent to that of the conventional low-pass filter. Another objective of the present invention is to provide a PLL including such a low-pass filter.

A measure taken by the present invention for achieving the above objectives is a low-pass filter which smoothes an electric current supplied at an input terminal and outputs a voltage, comprising: a first partial circuit including a capacitive element, one end of the first partial circuit being connected to the input terminal, the voltage being output from the other end of the first partial circuit; a voltage buffer circuit to which a voltage at a predetermined node in the first partial circuit is input; and a second partial circuit, one end of the second partial circuit being connected to the input terminal, the other end being connected to an output terminal of the voltage buffer circuit.

In the above structure, one end of the first partial circuit and one end of the second partial circuit are connected to the input terminal of the low-pass filter. Thus, the electric current supplied to the input terminal is divided, and the resultant electric currents respectively flow into the first and second partial circuits. That is, the electric current which flows into the first partial circuit is smaller than the electric current supplied to the low-pass filter. Accordingly, the size of the capacitive element in the first partial circuit is relatively decreased. Further, since the other end of the second partial circuit is connected to the output terminal of the voltage buffer circuit, the voltage at the other end of the second partial circuit is equal to the voltage at a predetermined node in the first partial circuit. Thus, the second partial circuit operates as if part of the first partial circuit which is subsequent to the predetermined node is connected to the output terminal. That is, a circuit which would be provided at a stage subsequent to the second partial circuit is omitted, and accordingly, the circuit area of the entire low-pass filter circuit is reduced.

Another measure taken by the present invention is a phase locked loop comprising: a charge pump circuit; a voltage-controlled oscillator; and a low-pass filter which smoothes an electric current output to/input from the charge pump circuit and outputs a voltage for controlling the voltage-controlled oscillator, wherein the loop filter includes a first partial circuit including a capacitive element, one end of the first partial circuit being connected to an output terminal of the charge pump circuit, the voltage being output from the other end of the first partial circuit, a voltage buffer circuit to which a voltage at a predetermined node in the first partial circuit is input, and a second partial circuit, one end of the second partial circuit being connected to an output terminal of the charge pump circuit, the other end being connected to an output terminal of the voltage buffer circuit.

In the above structure, one end of the first partial circuit and one end of the second partial circuit are connected to the output terminal of the charge pump circuit. Thus, the electric current output from the charge pump circuit is divided, and the resultant electric currents respectively flow into the first and second partial circuits. That is, the electric current which flows into the first partial circuit is smaller than the electric current supplied to the low-pass filter. Accordingly, the size of the capacitive element in the first partial circuit is relatively decreased. Further, since the other end of the second partial circuit is connected to the output terminal of the voltage buffer circuit, the voltage at the other end of the second partial circuit is equal to the voltage at a predetermined node in the first partial circuit. Thus, the second partial circuit operates as if part of the first partial circuit which is subsequent to the predetermined node is connected to the output terminal. That is, a circuit which would be provided at a stage subsequent to the second partial circuit is omitted, and accordingly, the circuit area of the entire loop filter circuit, i.e., the circuit area of the entire phase locked loop, is reduced.

Preferably, the loop filter has a switch for switching the presence/absence of an electric connection between the one end of the first partial circuit and the one end of the second partial circuit. The switch is in a conductive state at least during a period when an electric current is output from/input to the charge pump circuit but otherwise is in a nonconductive state.

With the above structure, a leak current generated from the voltage buffer circuit in the loop filter is prevented from being routed to the first partial circuit during a period no electric current is output from/input to the charge pump circuit, whereby an influence of the leak current on the output of the phase locked loop is avoided.

Specifically, the switch is in a conductive state when any of a signal for controlling the outflow of an electric current from the charge pump circuit and a signal for controlling the inflow of an electric current into the charge pump circuit is active.

Specifically, the switch includes first and second partial switches which are connected in parallel. The first partial switch is in a conductive state when the signal for controlling the outflow of the electric current from the charge pump circuit is active. The second partial switch is in a conductive state when the signal for controlling the inflow of the electric current into the charge pump circuit is active.

DESCRIPTION OF THE PREFERRED EMBODIMENTS

Hereinafter, embodiments of the present invention are described with reference to the drawings.

Embodiment 1

Figure 1:
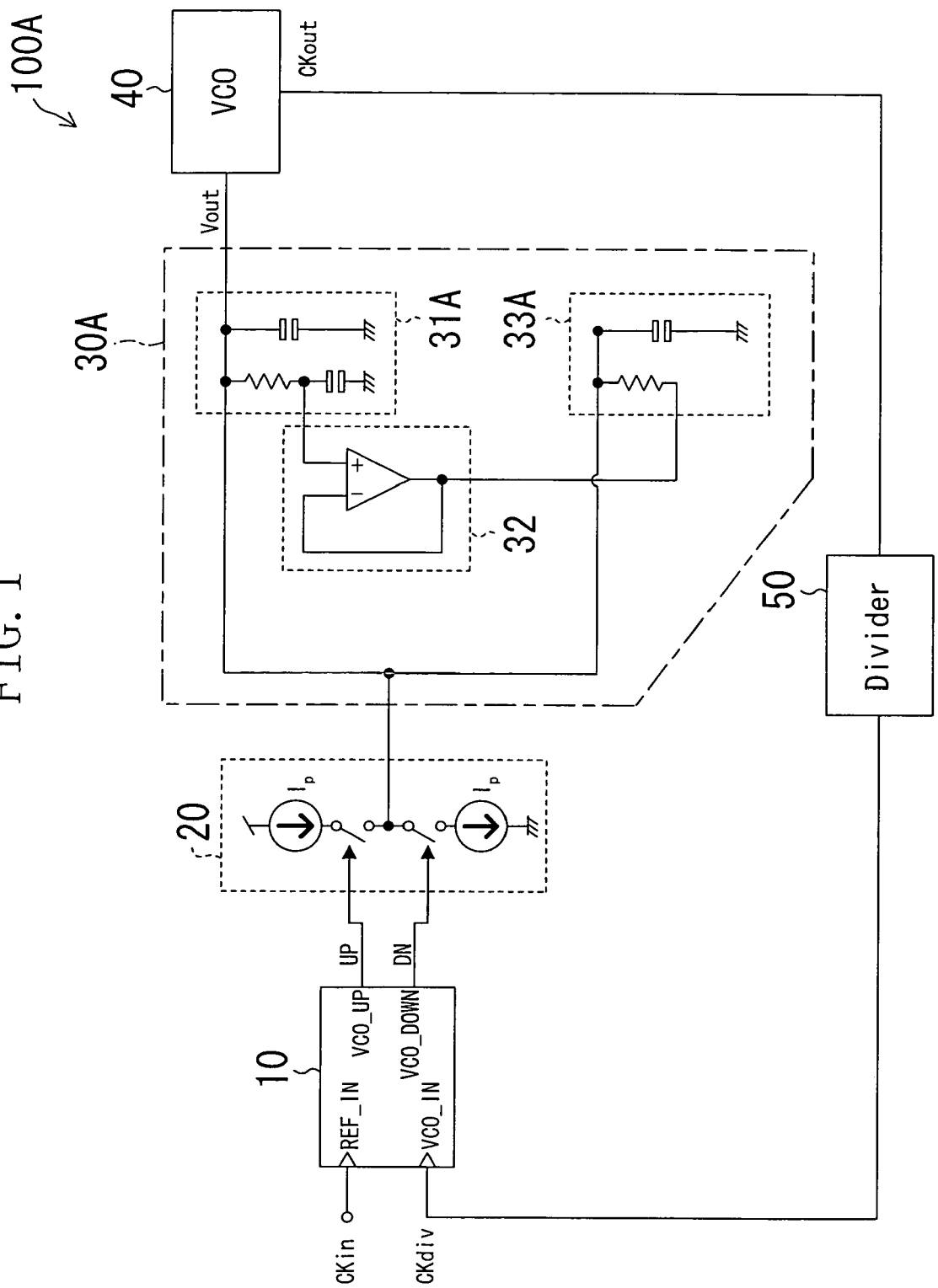
FIG. 1 shows a structure of a PLL according to embodiment 1 of the present invention.

FIG. 1 shows a structure of a PLL according to embodiment 1 of the present invention. The PLL 100A of embodiment 1 includes a loop filter 30A which has a structure different from that of the loop filter 30 of the PLL 100 shown in FIG. 9. The other components are the same as those described above, and therefore, descriptions thereof are herein omitted. Hereinafter, the loop filter 30A is described in detail.

The loop filter 30A includes a filter circuit (first partial circuit) 31A, a voltage buffer circuit 32 which is formed by an operational amplifier, and a filter circuit (second partial circuit) 33A. One end of the filter circuit 31A and one end of the filter circuit 33A are connected to an output terminal of a charge pump circuit 20. The other end of the filter circuit 31A is connected to a voltage-controlled oscillator 40. An input terminal of the voltage buffer circuit 32 is connected to a predetermined node in the filter circuit 31A. An output terminal of the voltage buffer circuit 32 is connected to the other end of the filter circuit 33A.

Figure 9:
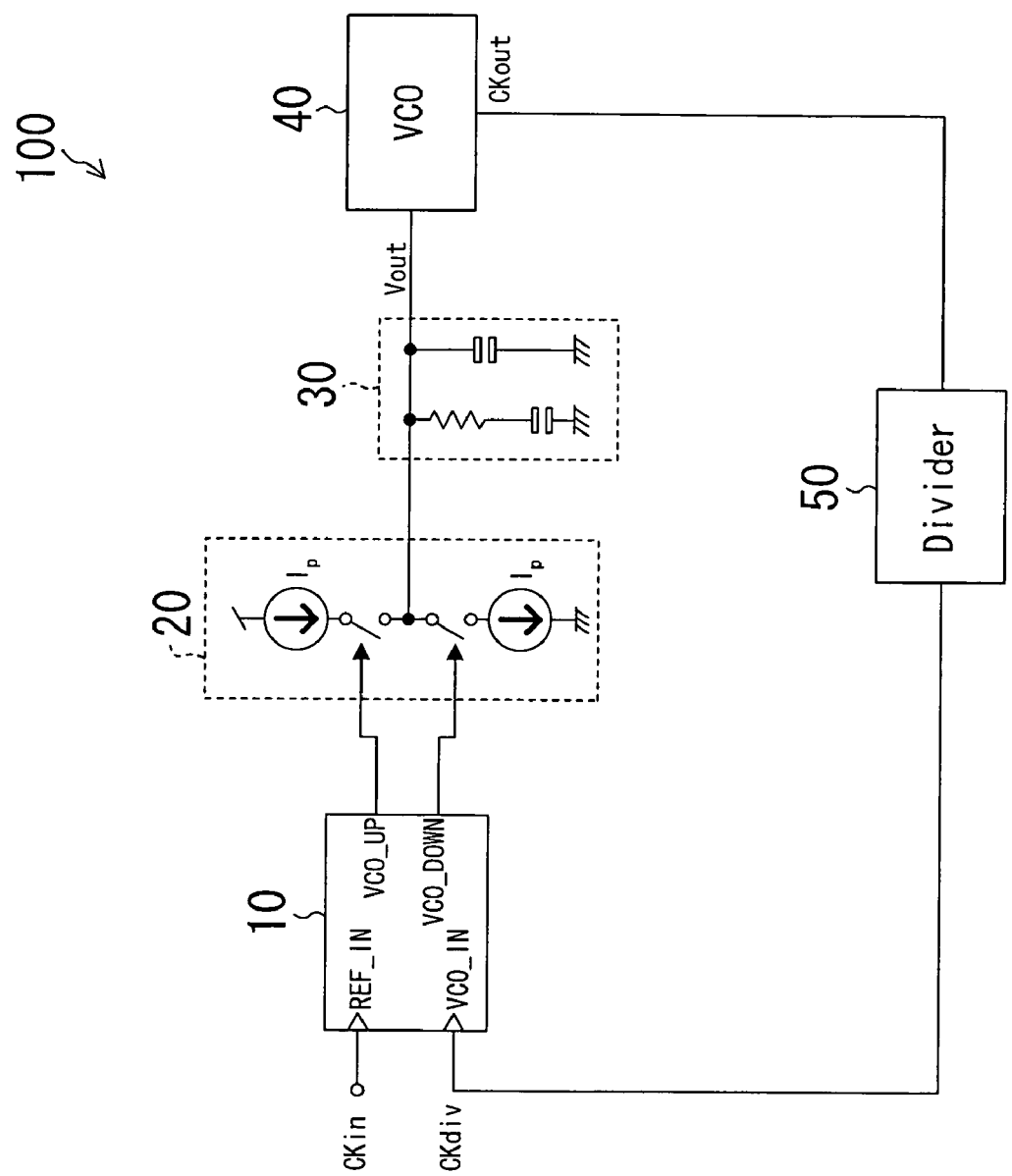
FIG. 9 shows a structure of a generally-employed PLL.

Next, it is described that the loop filter 30A exhibits a transfer characteristic equivalent to that of the loop filter 30 of FIG. 9.

Figure 2:
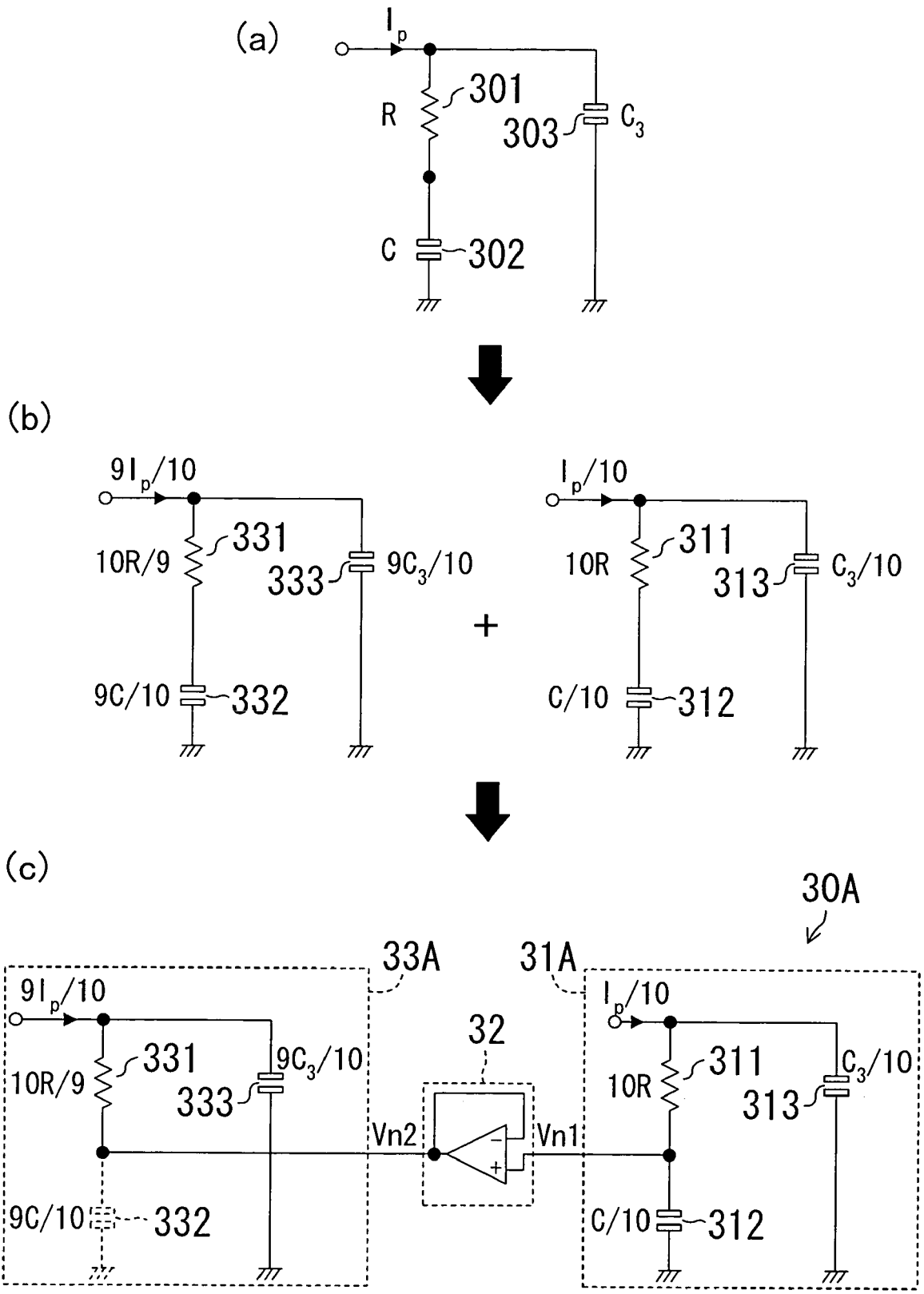
FIG. 2 illustrates the circuit conversion from a conventional passive low-pass filter to a passive low-pass filter of the present invention.

FIG. 2 illustrates the circuit conversion from a conventional passive low-pass filter to a passive low-pass filter of the present invention. The low-pass filter shown in part (a) of FIG. 2 is the loop filter 30 shown in FIG. 9. In the low-pass filter shown in part (a) of FIG. 2, input current Ip is multiplied by K while the resistance value of a resistive element 301 (resistance value R) is multiplied by 1/K, and the capacitance value of a capacitive element 302 (capacitance value C) and the capacitance value of a capacitive element 303 (capacitance value $C_3$) are each multiplied by K, whereby resultant transfer characteristic is exactly the same as that of the original low-pass filter. Thus, the low-pass filter shown in part (a) of FIG. 2 is considered to be a combination of a low-pass filter which is formed by a resistive element 311 (resistance value 10R), a capacitive element 312 (capacitive value C/10) and a capacitive element 313 (capacitive value $C_3/10$) and whose input current is Ip/10 (see right-hand part of part (b) of FIG. 2) and a low-pass filter which is formed by a resistive element 331 (resistive value 10R/9), a capacitive element 332 (capacitive value 9C/10) and a capacitive element 333 (capacitive value $9C_3/10$) and whose input current is 9Ip/10 (see left-hand part of part (b) of FIG. 2).

As shown in part (c) of FIG. 2, node voltage Vn1 between the resistive element 311 and the capacitive element 312 in the low-pass filter shown in the right-hand part of part (b) of FIG. 2 and node voltage Vn2 between the resistive element 331 and the capacitive element 332 in the low-pass filter shown in the left-hand part of part (b) of FIG. 2, which have the same potential, are connected to each other through the voltage buffer circuit 32. In this way, node voltage Vn2 is simulated with node voltage Vn1, whereby the capacitive element 332 is omitted. That is, the capacitive element 302 in the low-pass filter of part (a) of FIG. 2 is substantially reduced to a 1/10. The thus-obtained low-pass filter is exactly the same as the loop filter 30A of FIG. 1. In general, in the case where the low-pass filter of part (a) of FIG. 2 is used as a loop filter of a PLL, the capacitive element 302 is the largest component over the device area. Thus, reducing the size (area) of the capacitive element 302 produces a large advantageous effect in the reduction of the circuit area of the entire loop filter.

Thus, according to embodiment 1, a passive loop filter with greatly reduced size as compared with a conventional passive loop filter is obtained while the transfer characteristic thereof is kept equivalent to that of the conventional passive loop filter.

In the example described above, the capacitive element 302 in part (a) of FIG. 2 is reduced to a 1/10, but the present invention is not limited thereto. For example, the capacitance value of the capacitive element 302 can be reduced to a 1/100 by setting the input current of the filter circuit 31A to Ip/100 and setting the input current of the filter circuit 33A to 99Ip/100. It is apparent that the capacitance value of the capacitive element 31 is further reduced. The voltage buffer circuit 32 may be formed by an element other than the operational amplifier.

Embodiment 2

Figure 3:
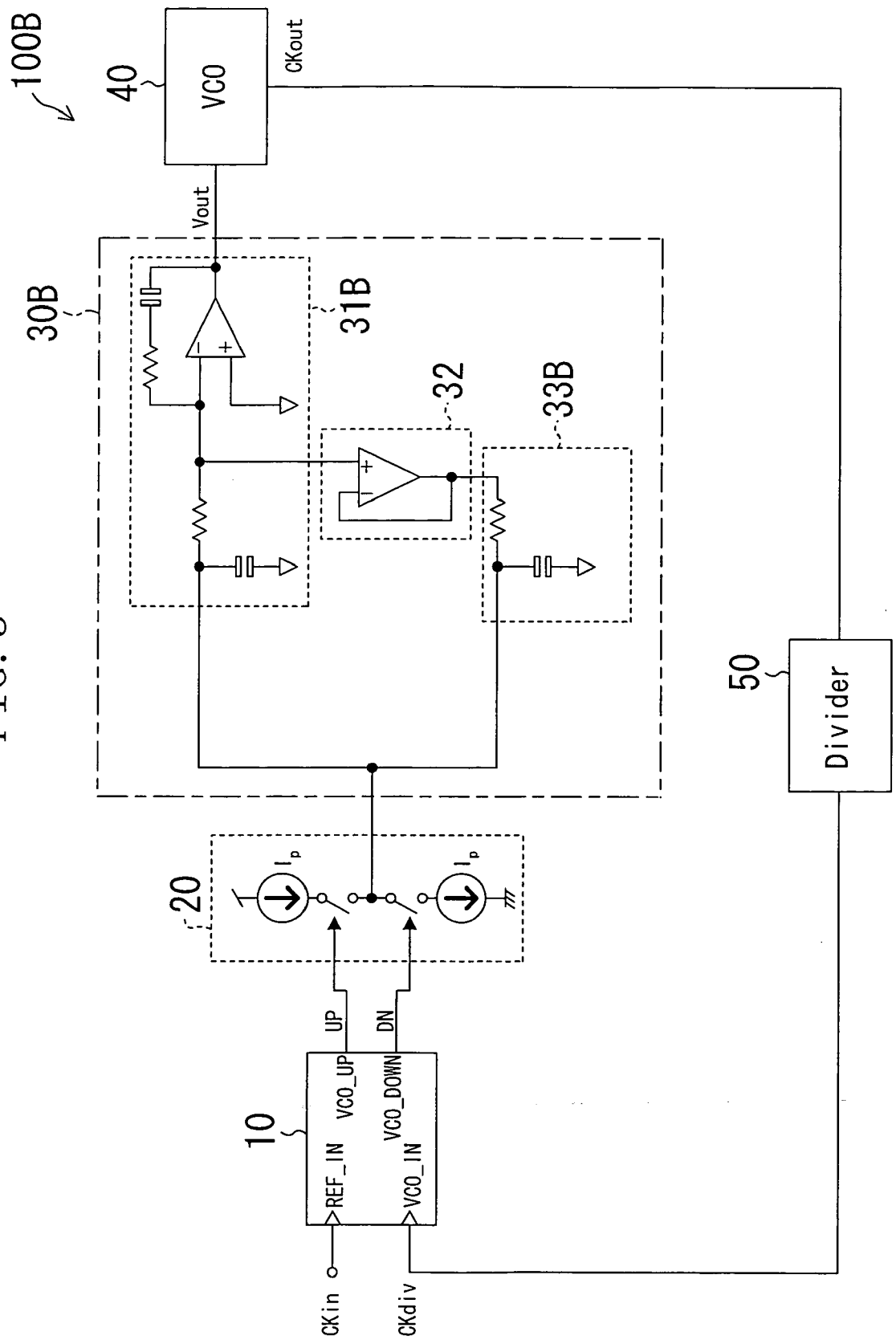
FIG. 3 shows a structure of a PLL according to embodiment 2 of the present invention.

FIG. 3 shows a structure of a PLL according to embodiment 2 of the present invention. The PLL 100B of embodiment 2 is obtained by replacing the loop filter 30A of embodiment 1 with an active loop filter 30B. The other components are the same as those described above, and therefore, descriptions thereof are herein omitted. Hereinafter, the loop filter 30B is described in detail.

The loop filter 30B includes a filter circuit (first partial circuit) 31B, a voltage buffer circuit 32 which is formed by an operational amplifier, and a filter circuit (second partial circuit) 33B. One end of the filter circuit 31B and one end of the filter circuit 33B are connected to an output terminal of a charge pump circuit 20. The other end of the filter circuit 31B is connected to a voltage-controlled oscillator 40. An input terminal of the voltage buffer circuit 32 is connected to a predetermined node in the filter circuit 31B. An output terminal of the voltage buffer circuit 32 is connected to the other end of the filter circuit 33B.

Next, it is described that the loop filter 30B exhibits a transfer characteristic equivalent to that of a generally-employed active loop filter.

Figure 4:
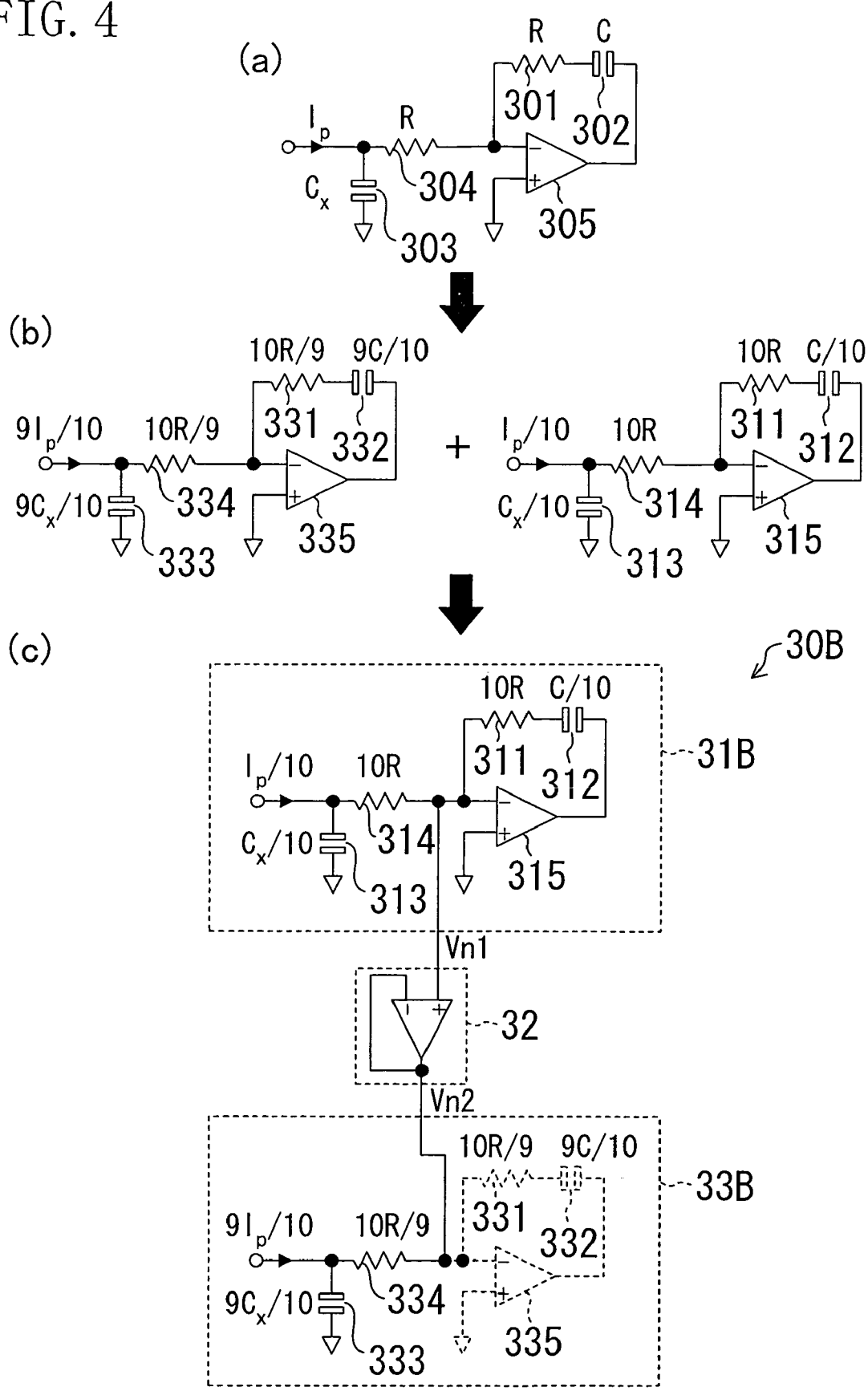
FIG. 4 illustrates the circuit conversion from a conventional active low-pass filter to an active low-pass filter of the present invention.

FIG. 4 illustrates the circuit conversion from a conventional active low-pass filter to an active low-pass filter of the present invention. Part (a) of FIG. 4 shows a conventional, generally-employed active low-pass filter which includes an operational amplifier 305. The operational amplifier 305 is provided with a resistive element 301 and a capacitive element 302 in the negative feedback section. In the low-pass filter shown in part (a) of FIG. 4, input current Ip is multiplied by K while the resistance value of a resistive element 301 (resistance value R) and the resistance value of a resistive element 304 (resistance value R) are each multiplied by 1/K, and the capacitance value of a capacitive element 302 (capacitance value C) and the capacitance value of a capacitive element 303 (capacitance value $C_X$) are each multiplied by K, whereby resultant transfer characteristic is exactly the same as that of the original low-pass filter. Thus, the low-pass filter shown in part (a) of FIG. 4 is considered to be a combination of a low-pass filter which is formed by a resistive element 311 (resistive value 10R), a capacitive element 312 (capacitive value C/10), a capacitive element 313 (capacitive value $C_X/10$), a resistive element 314 (resistive value 10R), and an operational amplifier 315, and whose input current is Ip/10 (see right-hand part of part (b) of FIG. 4) and a low-pass filter which is formed by a resistive element 331 (resistive value 10R/9), a capacitive element 332 (capacitive value 9C/10), a capacitive element 333 (capacitive value $9C_X/10$), a resistive element 334 (resistive value 10R/9) and an operational amplifier 335, and whose input current is 9Ip/10 (see left-hand part of part (b) of FIG. 4).

As shown in part (c) of FIG. 4, node voltage Vn1 between the resistive element 311 and the resistive element 314 in the low-pass filter shown in the right-hand part of part (b) of FIG. 4 and node voltage Vn2 between the resistive element 331 and the resistive element 334 in the low-pass filter shown in the left-hand part of part (b) of FIG. 4, which have the same potential, are connected to each other through the voltage buffer circuit 32. In this way, node voltage Vn2 is simulated with node voltage Vn1, whereby a section formed by the resistive element 331, the capacitive element 333 and the operational amplifier 335 is omitted. That is, the capacitive element 302 in the low-pass filter of part (a) of FIG. 4 is substantially reduced to a 1/10. The thus-obtained low-pass filter is exactly the same as the loop filter 30B of FIG. 3. In general, in the case where the low-pass filter of part (a) of FIG. 4 is used as a loop filter of a PLL, the capacitive element 302 is the largest component over the device area. Thus, reducing the size (area) of the capacitive element 302 produces a large advantageous effect in the reduction of the circuit area of the entire loop filter.

Thus, according to embodiment 2, an active loop filter with greatly reduced size as compared with a conventional passive loop filter is obtained while the transfer characteristic thereof is kept equivalent to that of the conventional loop filter.

In the example described above, the capacitive element 302 in part (a) of FIG. 4 is reduced to a 1/10, but the present invention is not limited thereto. For example, the capacitance value of the capacitive element 302 can be reduced to a 1/100 by setting the input current of the filter circuit 31B to Ip/100 and setting the input current of the filter circuit 33B to 99Ip/100. It is apparent that the capacitance value of the capacitive element 31 is further reduced. The voltage buffer circuit 32 may be formed by an element other than the operational amplifier.

Embodiment 3

Figure 5:
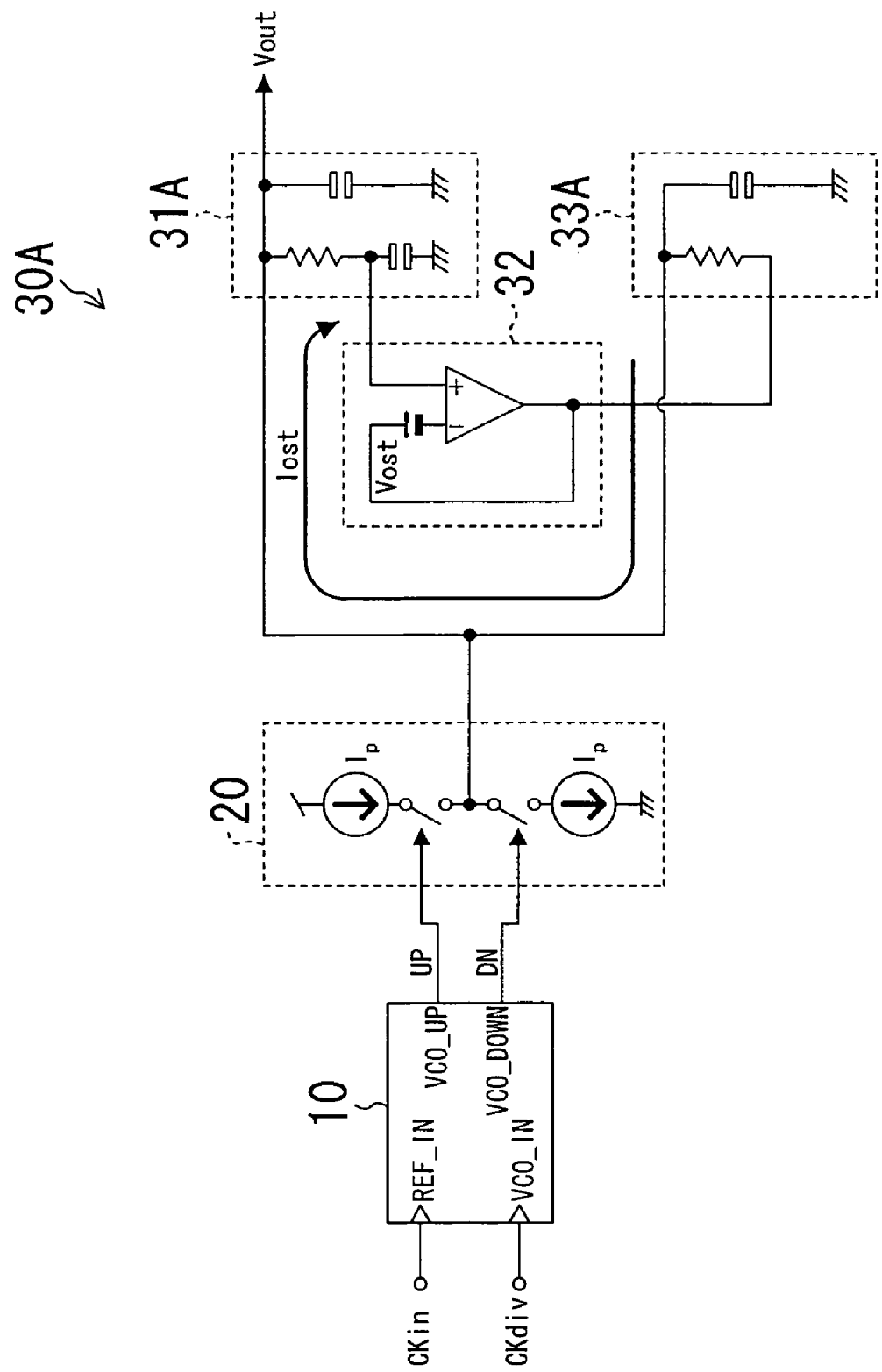
FIG. 5 illustrates the effect of a leak current in a voltage buffer circuit on the output of the PLL.

In the loop filter 30A of embodiment 1, there is a possibility that the offset voltage existing in the operational amplifier which forms the voltage buffer circuit 32 have an influence on the output of the PLL. FIG. 5 illustrates the influence of a leak current on the output of the PLL. As shown in FIG. 5, if offset voltage Vost exists in the voltage buffer circuit 32, a capacitive element in the filter circuit 31A is always charged with leak current lost. An increased part of the voltage of the capacitive element by the leak current is canceled during the operation of the frequency phase comparator 10. Thus, output voltage Vout of the filter circuit 31A is varied by leak current lost. Accordingly, a variation in the frequency of the voltage-controlled oscillator occurs, and the jitter of the output clock of the PLL increases.

Figure 6:
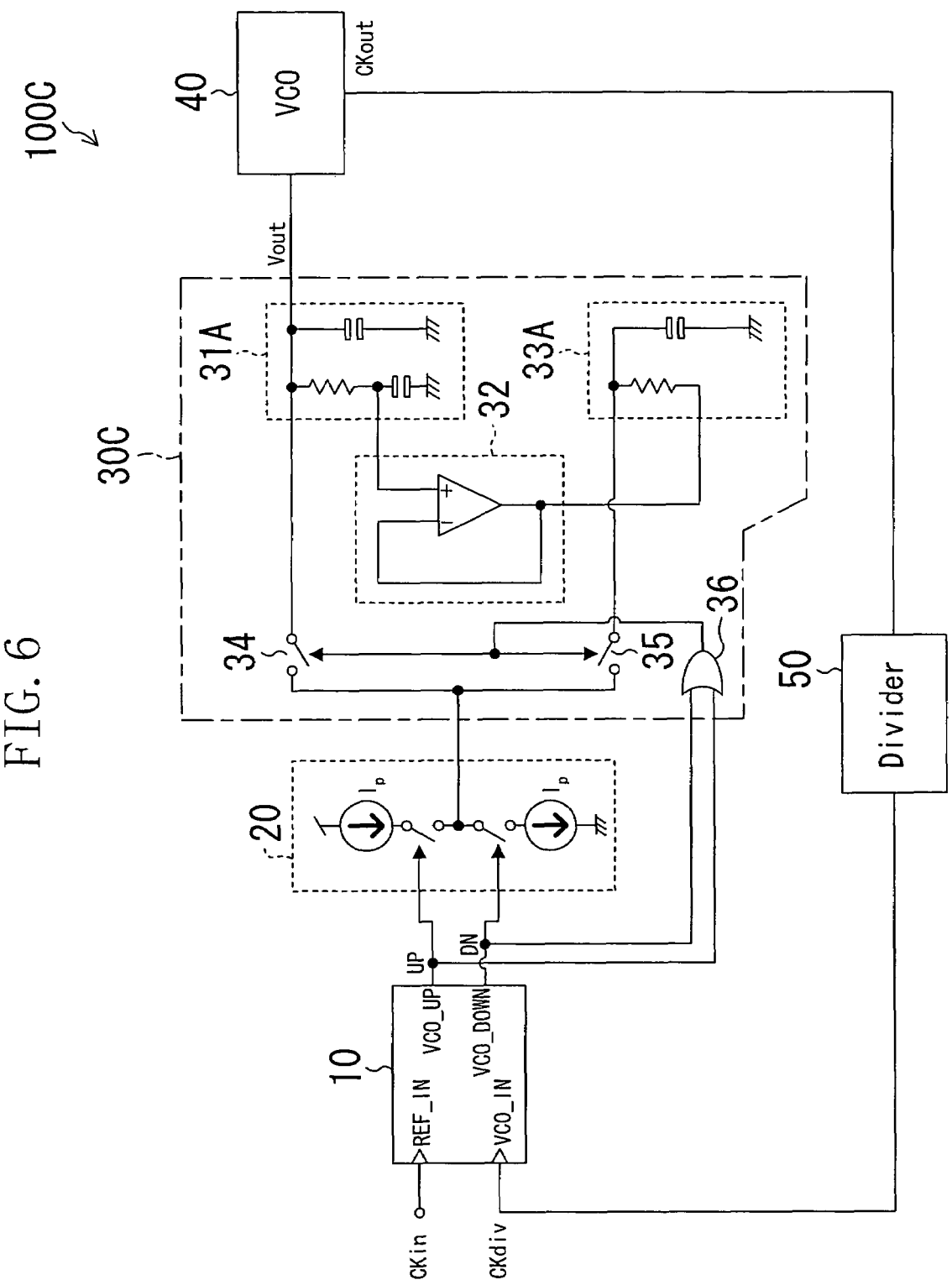
FIG. 6 shows a structure of a PLL according to embodiment 3 of the present invention.

A PLL of embodiment 3 of the present invention, which is shown in FIG. 6, includes countermeasures for solving the above problems. The PLL 100C of embodiment 3 includes, in addition to the components of the loop filter 30A of the PLL 100A of embodiment 1, switches 34 and 35 and an OR logic element 36 for controlling the switches 34 and 35. The switches 34 and 35 switch the presence/absence of an electric connection between a terminal of the filter circuit 31A which is closer to the charge pump circuit 20 and a terminal of the filter circuit 33A which is closer to the charge pump circuit 20. Hereinafter, the operation of the switches 34 and 35 and the OR logic element 36 is described.

The OR logic element 36 calculates the logical sum of signals UP and DN which are output from the frequency phase comparator 10. The switches 34 and 35 switch the conduction state (conductive/nonconductive) according to the calculation result of the OR logic element 36. Specifically, the switches 34 and 35 establish a conductive state when at least one of signal UP and signal DN is activated. When both signal UP and signal DN are inactive, the switches 34 and 35 establish a nonconductive state. With such a structure, when the frequency phase comparator 10 is not in operation, the leak current is removed such that the leak current from the voltage buffer circuit 32 is prevented from flowing into the filter circuit 31A. Thus, the influence of the leak current on the output of the PLL is avoided.

As described above, according to embodiment 3, the influence of the leak current from the voltage buffer circuit 32 on the output of the PLL is avoided.

In the above example, two switches 34 and 35 are provided, but any one of these may be omitted. The OR logic element 36 receives signal UP and signal DN in the above example, but the present invention is not limited thereto. The above effects are obtained also in the case where a signal which is kept active at least during the operation of the frequency phase comparator 10 is input to the OR logic element 36 or in the case where such a signal is used to directly control the switches 34 and 35 while the OR logic element 36 is omitted.

Embodiment 4

Figure 7:
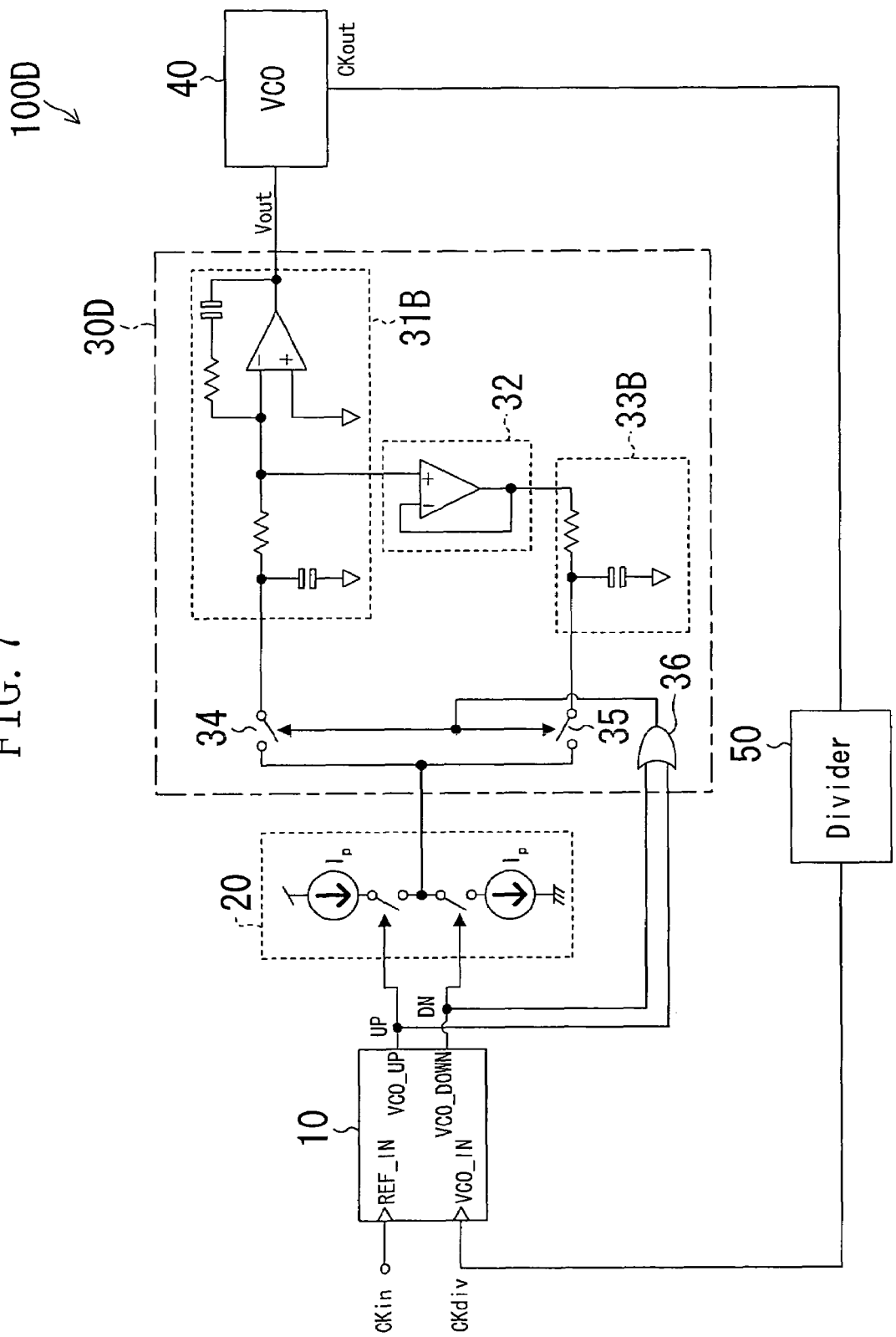
FIG. 7 shows a structure of a PLL according to embodiment 4 of the present invention.

The problem caused by the leak current, which has been described at the beginning of embodiment 3, also occurs in the loop filter 30B of embodiment 2. A PLL of embodiment 4 of the present invention which is shown in FIG. 7 includes countermeasures for solving the problem. The PLL 100D of embodiment 4 includes, in addition to the components of the loop filter 30B of the PLL 100B of embodiment 2, the switches 34 and 35 and the OR logic element 36 which have been described in embodiment 3. That is, the PLL 100D of embodiment 4 which includes an active loop filter also achieves the same effects as those achieved by the PLL 100C of embodiment 3 which includes an active loop filter.

Also in embodiment 4, as described above, any one of the switches 34 and 35 may be omitted. The signals input to the OR logic element 36 may be replaced with other signals. The OR logic element 36 may be omitted.

Embodiment 5

Figure 8:
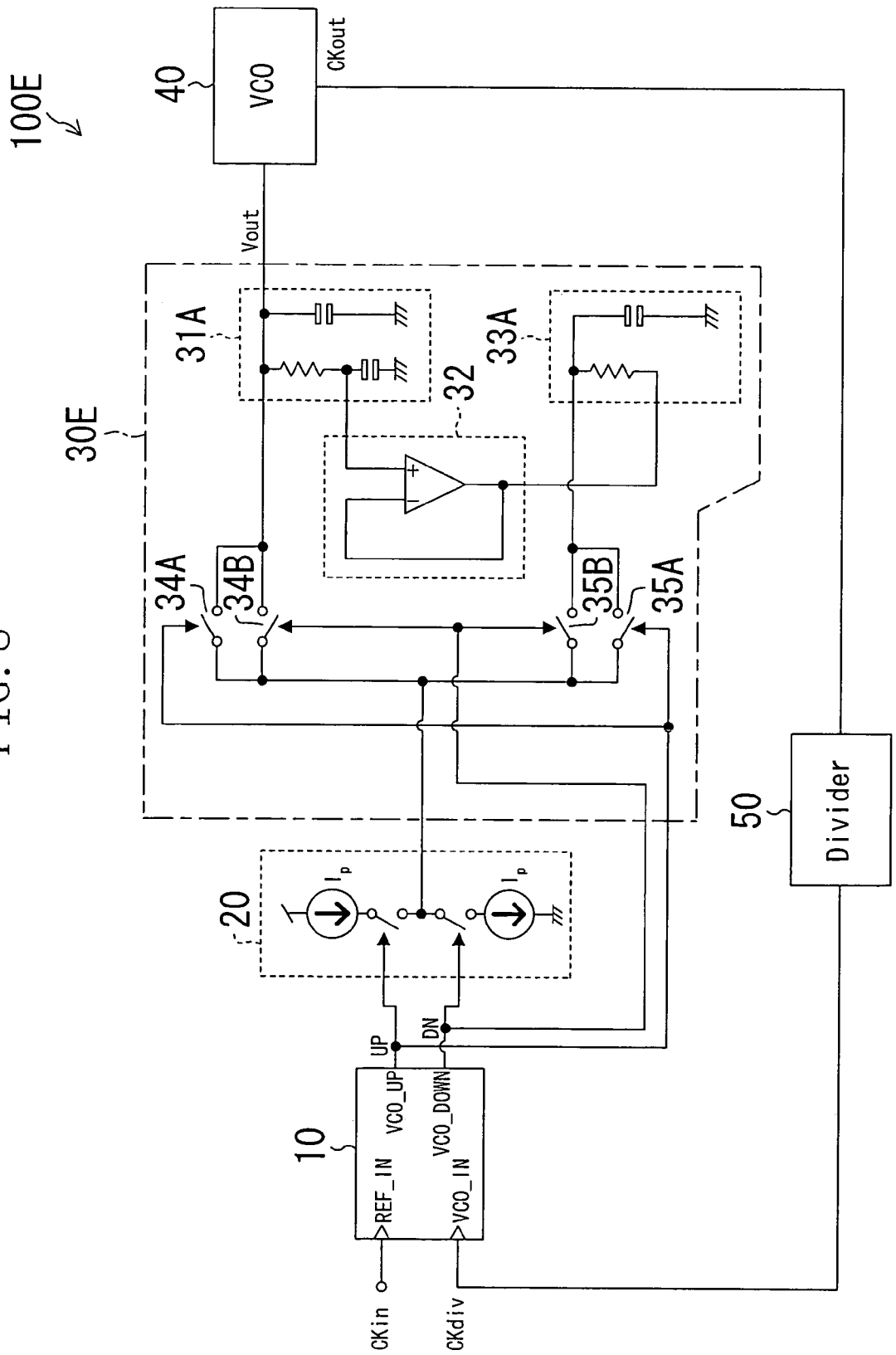
FIG. 8 shows a structure of a PLL according to embodiment 5 of the present invention.

FIG. 8 shows a structure of a PLL according to embodiment 5 of the present invention. The PLL 100E of embodiment 5 is also designed to solve the problem caused by the leak current which has been described at the beginning of embodiment 3. The PLL 100E includes switches 34A, 34B, 35A and 35B in addition to the components of the loop filter 30A of the PLL 100A of embodiment 1. The switches 34A, 34B, 35A and 35B switch the presence/absence of an electric connection between a terminal of the filter circuit 31A which is closer to the charge pump circuit 20 and a terminal of the filter circuit 33A which is closer to the charge pump circuit 20. Hereinafter, the operation of the switches 34A, 34B, 35A and 35B is described.

The pair of switches 34A and 34B, which are connected in parallel, function as a switch which is in a conductive state when at least one of signal UP and signal DN is active. In this combination switch, the switches 34A and 34B function as a first partial switch and a second partial switch of the present invention, respectively. The switch 34A is in a conductive state when signal UP output from the frequency phase comparator 10 is active but is in a nonconductive state when signal UP is inactive. The switch 34B is in a conductive state when signal DN output from the frequency phase comparator 10 is active but is in a nonconductive state when signal DN is inactive. The switches 35A and 35B function in the same manner.

As described above, according to embodiment 5, the influence of the leak current from the voltage buffer circuit 32 on the output of the PLL is avoided.

Although in the loop filter 30C of embodiment 3 and the loop filter 30D of embodiment 4 a delay is caused when signal UP or signal DN passes through the OR logic element 36, a delay is not caused in the control of the switches 34A, 34B, 35A and 35B in the loop filter 30E of embodiment 5 because it is not necessary to calculate the logical sum of signal UP and signal DN. Thus, according to embodiment 5, the switches 34A, 34B, 35A and 35B operate without any timing error so that normal charge pump operation is performed.

In the above example, two pairs of switches, the switches 34A and 34B and the switches 35A and 35B, are provided. However, any one pair of the switches may be omitted. The switches 34A, 34B, 35A and 35B receive signal UP and signal DN, but the present invention is not limited thereto. The above-described effects are achieved even when the switches 34A, 34B, 35A and 35B are controlled based on a signal which is kept active at least during the operation of the frequency phase comparator 10.

The above-described effects are achieved even when the loop filter 30E of embodiment 5 is modified into an active loop filter.

All the above-described embodiments are directed to PLLs. However, as a matter of course, a low-pass filter of the present invention is usable as a loop filter in a DLL (Delay Locked Loop).

As described above, according to the present invention, a low-pass filter which has a reduced size as compared with a conventional low-pass filter but has filtering characteristics equivalent to those of the conventional low-pass filter is realized. By using the low-pass filter of the present invention as a loop filter in a PLL, the circuit area of the entire PLL is greatly reduced.

The inputs and outputs of the low-pass filter of the present invention are the same as those of a conventional low-pass filter. Thus, the low-pass filter of the present invention can be incorporated as a loop filter without making a modification to the circuit components other than the loop filter.

The replacement of a conventional loop filter by the low-pass filter of the present invention is fairly easy, and the circuit area of a PLL is greatly reduced by the replacement.

What is claimed is:

1. A phase locked loop, comprising:
    a charge pump circuit;
    a voltage-controlled oscillator; and
    a low-pass filter which smoothes an electric current output to/input from the charge pump circuit and outputs a voltage for controlling the voltage-controlled oscillator, wherein the loop filter includes:
        a first partial circuit including a capacitive ele ment, one end of the first partial circuit being connected to an output terminal of the charge pump circuit, the voltage being output from the other end of the first partial circuit,
        a voltage buffer circuit to which a voltage at a predetermined node in the first partial circuit is input, and
        a second partial circuit, one end of the second partial circuit being connected to an output terminal of the charge pump circuit, the other end being connected to an output terminal of the voltage buffer circuit; and
    wherein:
        the loop filter has a switch for switching the presence/absence of an electric connection between the one end of the first partial circuit and the one end of the second partial circuit; and
        the switch is in a conductive state at least during a period when an electric current is output from/input to the charge pump circuit but otherwise is in a nonconductive state.

2. The phase locked loop of claim 1, wherein the switch is in a conductive state when any of a signal for controlling the outflow of an electric current from the charge pump circuit and a signal for controlling the inflow of an electric current into the charge pump circuit is active.

3. The phase locked loop of claim 1, wherein:
    the switch includes first and second partial switches which are connected in parallel;
    the first partial switch is in a conductive state when the signal for controlling the outflow of the electric current from the charge pump circuit is active; and
    the second partial switch is in a conductive state when the signal for controlling the inflow of the electric current into the charge pump circuit is active.

* * * * *